United States Patent
Miron et al.

(10) Patent No.: US 11,480,592 B2
(45) Date of Patent: Oct. 25, 2022

(54) METHOD AND SYSTEM OF TETHERED ROUTERS

(71) Applicant: ELECTRICAL GRID MONITORING LTD., Yavne (IL)

(72) Inventors: Eyal Miron, Hod-Hasharon (IL); Nimrod Sandlerman, Ramat-Gan (IL)

( * ) Notice: Subject to any disclaimer, the term of this patent is extended or adjusted under 35 U.S.C. 154(b) by 0 days.

(21) Appl. No.: 17/346,330

(22) Filed: Jun. 14, 2021

(65) Prior Publication Data

US 2021/0306722 A1    Sep. 30, 2021

Related U.S. Application Data

(63) Continuation of application No. 14/953,349, filed on Nov. 29, 2015, now Pat. No. 11,064,272.

(60) Provisional application No. 62/160,612, filed on May 13, 2015.

(51) Int. Cl.
| | |
|---|---|
| *G01R 19/25* | (2006.01) |
| *H04L 12/403* | (2006.01) |
| *H02J 50/20* | (2016.01) |
| *H04Q 9/00* | (2006.01) |
| *H04B 3/54* | (2006.01) |

(52) U.S. Cl.
CPC ......... *G01R 19/2513* (2013.01); *H02J 50/20* (2016.02); *H04L 12/403* (2013.01); *H04Q 9/00* (2013.01); *H04B 3/54* (2013.01); *H04Q 2209/40* (2013.01); *H04Q 2209/50* (2013.01); *H04Q 2209/88* (2013.01)

(58) Field of Classification Search
CPC .... G01R 19/2513; H02J 50/20; H04L 12/403; H04Q 9/00; H04Q 2209/40; H04Q 2209/50; H04Q 2209/88; H04B 3/54
See application file for complete search history.

(56) References Cited

U.S. PATENT DOCUMENTS

| | | | |
|---|---|---|---|
| 7,308,103 B2* | 12/2007 | Corcoran | H04L 9/08 455/445 |
| 2008/0198817 A1* | 8/2008 | Montemurro | H04W 52/0216 370/338 |
| 2009/0015239 A1* | 1/2009 | Georgiou | G01R 15/14 324/105 |
| 2010/0060479 A1* | 3/2010 | Salter | G01D 4/002 340/870.4 |
| 2015/0204480 A1* | 7/2015 | Lorimer | F16M 13/02 248/323 |

\* cited by examiner

*Primary Examiner* — James J Yang
(74) *Attorney, Agent, or Firm* — AlphaPatent Associates, Ltd; Daniel J. Swirsky

(57) ABSTRACT

A device and a method including a power supply module operative to extract electric power from magnetic field surrounding an electric cable, a transceiver operative to communicate in a backhaul network, a transceiver for a wireless local area network and/or a remote sensing unit, and a controller module communicatively coupled to the transceiver and/or remote sensing unit, where the device is mounted around a single electric cable of an electric transmission grid or an electric distribution grid, and where the device derives power form the single electric cable.

16 Claims, 2 Drawing Sheets

METHOD AND SYSTEM OF TETHERED ROUTERS

CROSS-REFERENCE TO RELATED APPLICATIONS

This application is a continuation of U.S. patent application Ser. No. 14/953,349, filed Nov. 29, 2015, which claims the benefit of U.S. Provisional Patent Application No. 62/160,612, filed May 13, 2015, the disclosure of which is incorporated herein by reference in its entirety.

FIELD

The method and apparatus disclosed herein are related to the fields of communications, and, more particularly but not exclusively, to wireless communication, and to the field of electric grid, and, more particularly but not exclusively, to electric transmission and distribution networks.

BACKGROUND

The use of unregulated RF spectrum is very popular and there is thus a widely recognized need to have a continuous coverage of wireless local area networks (such as Wi-Fi) in urban areas and along roads and highways. Similarly, there is a growing need for continuous remote sensing in similar in urban areas and along roads and highways. Both needs require connectivity to electric power and backhaul infrastructure, which may not be readily available where needed. It would therefore be highly advantageous to have, a wireless networking and remote sensing solutions devoid of the above limitations.

SUMMARY

According to one embodiment there is provided a method and/or a device including a power supply module operative to extract electric power from magnetic field surrounding an electric cable, a transceiver operative to communicate in a backhaul network, at least one of a transceiver for a wireless local area network, and a remote sensing unit, and a controller module communicatively coupled to at least one of the transceiver and the remote sensing unit, where the device is mounted around a single electric cable of at least one of an electric transmission grid and an electric distribution grid, and where the device is derives power form the single electric cable.

According to another embodiment there is provided a method and/or a device where the backhaul network is at least one of a wireless mesh network, a cellular communication network, and a PLC network.

According to yet another embodiment there is provided a method and/or a device where at least one of the transceiver operative to communicate in a backhaul network and the transceiver for a wireless local area network is operative to communicate with another device according to the embodiment.

According to still another embodiment there is provided a method and/or a device where the transceiver operative to communicate in a backhaul network is communicatively coupled with the transceiver for a wireless local area network, thus enabling a communication device and/or a communication terminal and/or a node to communicate via said wireless local area network and said backhaul network with another communication device, and/or a communication terminal and/or node.

Further according to another embodiment there is provided a method and/or a device where the remote sensing unit includes at least one of: a camera, a microphone, a gas and/or pollution sensor, a light sensor, and a temperature sensor.

Still further according to another embodiment there is provided a method and/or a device where the remote sensing unit. is configured to provide a remote sensing measurement and wherein at least one of the transceiver operative to communicate in a backhaul network and the transceiver for a wireless local area network is operative to communicate the remote sensing measurement.

Yet further according to another embodiment there is provided a method and/or a device where the remote sensing unit. is configured to provide a remote sensing measurement and where at least one of the transceiver operative to communicate in a backhaul network and the transceiver for a wireless local area network is operative to communicate the remote sensing measurement to another device according to the embodiment.

According to still another embodiment there is provided a method and/or a device additionally including a propulsion module for maneuvering the device along the electric cable.

Further according to another embodiment there is provided a method and/or a device where the controller module is operative to use the propulsion module to move the device to improve at least one of a communication parameter, and a remote sensing parameter.

Still further according to another embodiment there is provided a method and/or a device where the communication parameter is associated with at least one of: the wireless mesh network, and the wireless local area network.

Yet further according to another embodiment there is provided a method and/or a device where the communication parameter is associated with at least one of: bandwidth, latency, jitter and signal-to-noise ratio (SNR).

Even further According to another embodiment there is provided a method and/or a device where the remote sensing parameter is associated with at least one of: proximity to a target, and field of view.

Unless otherwise defined, all technical and scientific terms used herein have the same meaning as commonly understood by one of ordinary skill in the relevant art. The materials, methods, and examples provided herein are illustrative only and not intended to be limiting. Except to the extent necessary or inherent in the processes themselves, no particular order to steps or stages of methods and processes described in this disclosure, including the figures, is intended or implied. In many cases the order of process steps may vary without changing the purpose or effect of the methods described.

BRIEF DESCRIPTION OF THE DRAWINGS

Various embodiments are described herein, by way of example only, with reference to the accompanying drawings. With specific reference now to the drawings in detail, it is stressed that the particulars shown are by way of example and for purposes of illustrative discussion of the embodiments only, and are presented in order to provide what is believed to be the most useful and readily understood description of the principles and conceptual aspects of the embodiment. In this regard, no attempt is made to show structural details of the embodiments in more detail than is necessary for a fundamental understanding of the subject matter, the description taken with the drawings making In the drawings.

DETAILED DESCRIPTION

Figure 1:
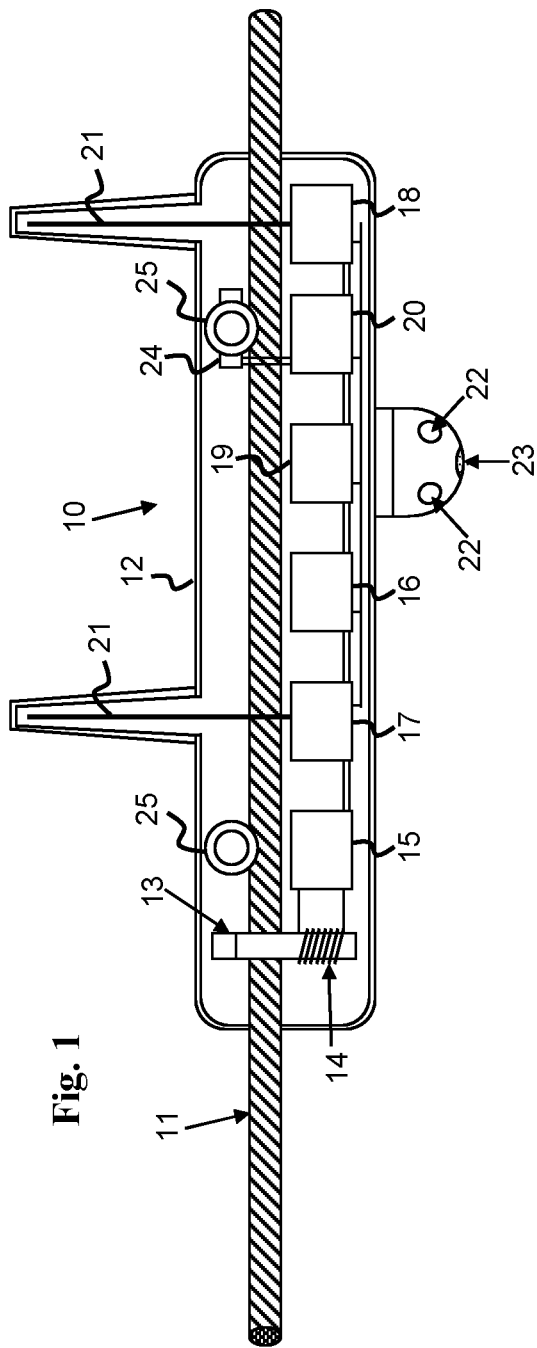
FIG. 1 is a simplified illustration of a wireless device mounted on an electric cable.

The present embodiments comprise a method and a system providing a wireless device readily mountable on an electric cable. The principles and operation of a device and method for providing effective coverage of wireless communication and/or remote sensing according to several embodiments may be better understood with reference to the following drawings and accompanying description.

Before explaining at least one embodiment in detail, it is to be understood that the embodiments are not limited in its application to the details of construction and the arrangement of the components set forth in the following description or illustrated in the drawings. Other embodiments may be practiced or carried out in various ways. Also, it is to be understood that the phraseology and terminology employed herein is for the purpose of description and should not be regarded as limiting.

In this document, an element of a drawing that is not described within the scope of the drawing and is labeled with a numeral that has been described in a previous drawing has the same use and description as in the previous drawings. Similarly, an element that is identified in the text by a numeral that does not appear in the drawing described by the text, has the same use and description as in the previous drawings where it was described.

The drawings in this document may not be to any scale. Different FIGS. may use different scales and different scales can be used even within the same drawing, for example different scales for different views of the same object or different scales for the two adjacent objects.

The purpose of the embodiments is to provide a wireless device which is readily mountable on an electric cable of any voltage rating. The wireless device provides wireless backhaul, and can provide local services such as local wireless networking and/or remote sensing.

Reference is now made to FIG. 1, which is a simplified illustration of a wireless device 10 mounted on an electric cable 11, according to one embodiment.

As shown in FIG. 1, the wireless device 10 may include a box, or a body, 12, through which the electric cable 11 passes. The box 12 may therefore be constructed of two parts, which may be opened, and then closed around the cable 11. Alternatively, box 12 may be constructed of a single block that is attached to the cable 11, or hang below the cable 11, without surrounding it.

The electric cable 11 may be a part of an electric transmission grid or an electric distribution network such as maintained by a power utility to provide electricity to the public, to industrial plants, etc. The wireless device 10 may therefore be mounted on a live cable 11. That is, when cable 11 is fully powered and/or carries electric voltage and/or electric current.

As shown in FIG. 1, the wireless device 10 may include a magnetic core 13 over which at least one coil is wrapped to form a winding 14. The magnetic core 13 may be mounted around the electric cable 11. The magnetic core 13 may be constructed from two parts, a part in each of the two parts of box 12, where the two parts of the magnetic core 13 are closed around electric cable 11 when box 12 is closed around electric cable 11. FIG. 1 shows wireless device 10 open, with one part of the box 12 removed, but with magnetic core 13 closed around electric cable 11.

Alternatively and/or additionally and/or optionally, magnetic core 13 may extend outside box 12 to be attached and/or mounted around electric cable 11 from the outside.

The magnetic core 13 typically derives magnetic field from the electric current flowing in the electric cable 11. Winding 14 typically derives electric current from the magnetic flux in the magnetic core 13. Winding 14 may be electrically coupled to power supply module 15, which, as shown in FIG. 1, typically provides electric voltage to other modules of wireless device 10.

It is appreciated that wireless device 10 may derive electric power from a single electric cable 11, and more particularly, from the electromagnetic field created by electric current flowing within the single electric cable 11. Therefore wireless device 10 is connected to this single electric cable 11, carrying a single electric phase, only, and is not connected to a neutral line or ground.

As shown in FIG. 1, the wireless device 10 may also include a controller module 16, a backhaul communication module 17, optionally a local area communication module 18, optionally a remote sensing module 19, and optionally a propulsion control module 20.

Controller modules 16 may include a processor unit, one or more memory units (e.g., random access memory (RAM), a non-volatile memory such as a Flash memory, etc.), one or more storage units (e.g. including a hard disk drive and/or a removable storage drive, etc.) as may be used to store and/or to execute a software program and associated data and to communicate with external devices.

Backhaul communication module 17 and local area communication module 18 may be coupled, each and/or both, to one or more antennas 21. Remote sensing module 19 may be coupled to and control various sensors such as a temperature sensor, a gas and/or pollution sensor, a light sensor, etc. (not shown), one or more cameras 22, one or more microphones 23, etc.

It is appreciated wireless device 10 may use backhaul communication module 17 to communicate in a backhaul network which may be, for example, a wireless mesh network, a cellular communication network, and/or a power line carrier (PLC, or power line communication) network. The backhaul communication network may enable wireless devices 10 to communicate between themselves, and/or with a remote server, and/or with a remote server via an intermediating unit such as a relay or a communication concentrator.

It is appreciated that a camera can be mounted on a system of axels providing three-dimensional rotation. Alternatively, a plurality, or an array, of fixed cameras can be mounted to cover a large field of view as needed.

Propulsion control module 20 may be coupled to one or more actuating devices such as electric motor 24, which may be coupled to one or more wheels 25. Wheels 25 may be mounted on cable 11 to enable propulsion control module 20 to move the wireless device 10 along cable 11 by controlling the electric motor 24.

It is appreciated that the propulsion system of wireless device 10 (including, but not limited to propulsion control module 20, one or more electric motors 24, one or more wheels 25, etc.) may be operative to move wireless device 10 along cable 11 and/or to rotate wireless device 10 around cable 11.

It is appreciated that electric motor 24 represents herein any type of technology adequate to maneuver wireless device 10 along and/or around cable 11, including, but not limited to, an AC motor, a DC motor, a stepper motor, a pneumatic pump and/or motor, a hydraulic pump and/or motor, or any other type of actuator.

Figure 2:
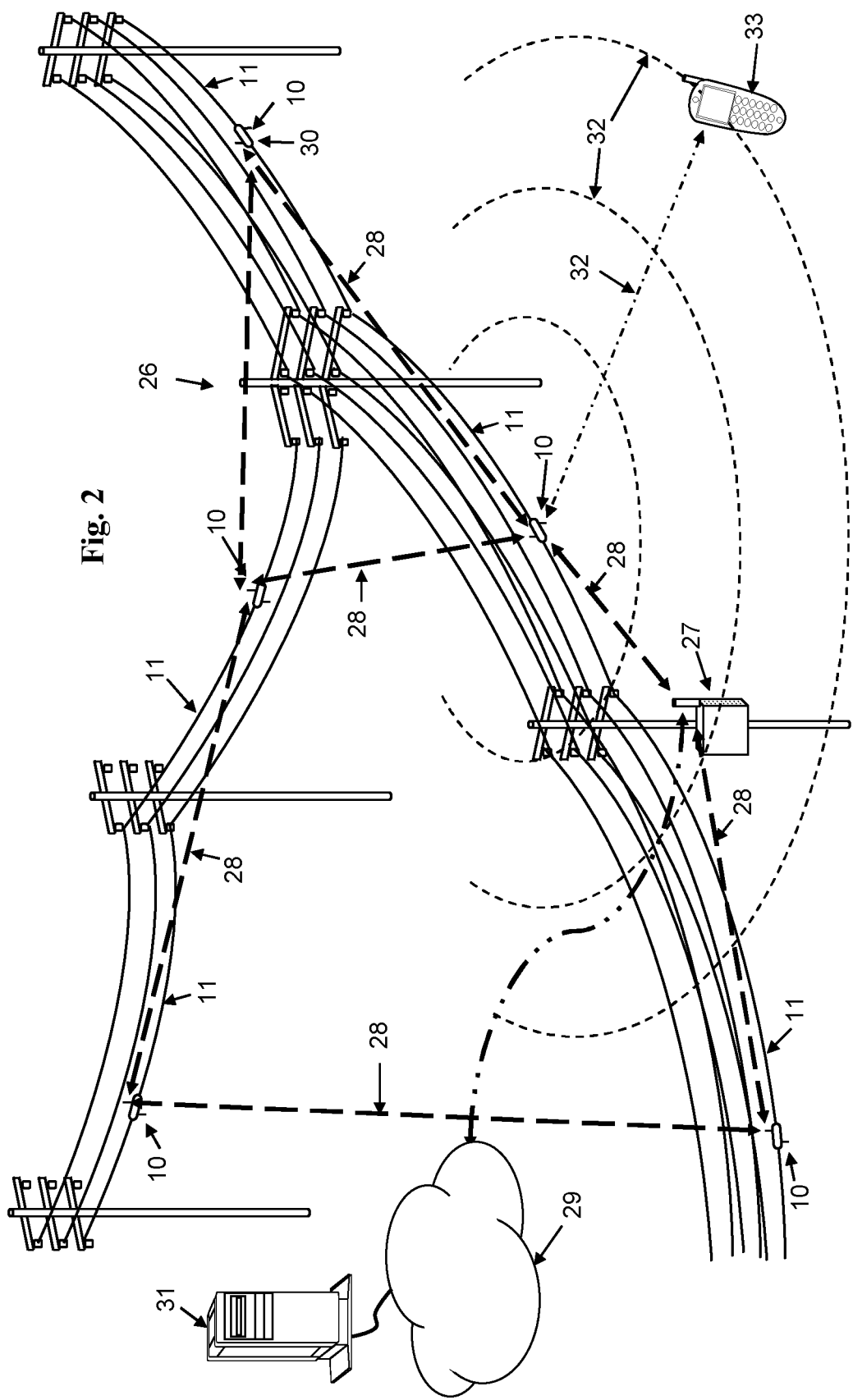
FIG. 2 is a simplified illustration of a plurality of wireless devices 10 mounted on an electric distribution network.

Reference is now made to FIG. 2, which is a simplified illustration of a plurality of wireless devices 10 mounted on an electric distribution network 26, and a backhaul unit 27, according to one embodiment.

As an option, the illustration of FIG. 2 may be viewed in the context of the details of the previous Figures. Of course, however, the illustration of FIG. 2 may be viewed in the context of any desired environment. Further, the aforementioned definitions may equally apply to the description below.

It is appreciated that the electric distribution network shown in FIG. 2 may represent any part of an electric grid including a high voltage transmission grid network.

As shown in FIG. 2, the wireless devices 10 are each mounted on a single electric cable 11. It is appreciated that a wireless devices 10 can be mounted on any phase-carrying electric cable 11. It is appreciated that a wireless devices 10 can be moved along electric cable 11, typically by controlling its motor 24.

As shown in FIG. 2, the wireless devices 10 communicate between themselves as a mesh network, and at least one of the wireless devices 10 communicate with backhaul unit 27.

Wireless devices 10 may use any type of wireless communication technology to communicate within the mesh network 28. Such wireless communication technology may be Wi-Fi, Zigbee, WiMAX, etc. For example, wireless devices 10 may use unregulated spectrum such as license exempt spectrum, or unregulated bands, or the Industrial, Scientific and Medical (ISM) band, etc. Alternatively, or additionally, wireless devices 10 may communicate within the mesh network 28 using power line carrier (PLC) technology.

It is appreciated that wireless device 10 is coupled to a single phase-carrying electric cable 11 and is not connected to a neutral or ground line to close the electric circuit. It is also noted that wireless device 10 is coupled to phase-carrying electric cable 11 via the magnetic field generated by cable 11 and not through direct electric contact (dry contact), which makes the installation of wireless device 10 fast and simple, and further enables moving wireless device 10 along cable 11 without disconnecting it from cable 11. Thus, cable 11 provides continuous electric power to wireless device 10 as wireless device 10 moves along cable 11.

Backhaul unit 27 may be connected to a long distance network 29, such as a wired wide area network (WAN) or metropolitan area network (MAN) or a wireless WAN (such as, for example, a cellular network) or a wireless MAN (such as, for example, WiMAX).

It is appreciated that a wireless device 10 such as wireless device 10 designated by numeral 30 may communicate with another network device such as remote server 31. For example, wireless device 30 may communicate with a near-by wireless device 10 using mesh network 28, and, via any number of such wireless devices 10 operating as relay stations in the mesh network 28, with any one of a plurality of backhaul unit 27. Wireless device 30 may then communicate via the backhaul unit 27, and via the long distance network 28, with the remote server 31. It is appreciated that remote server 31 is a non-limiting example of any type of communication equipment and/or terminal.

It is appreciated that wireless devices 10 may maneuver themselves, using their respective self-propulsion capabilities (e.g., propulsion control module 20, electric motor 24, wheels 25, etc.) to modify the distribution of the wireless devices 10 over the electric distribution network 26 and thus to optimize the topology of the mesh network 28. Optimizing mesh network 28 may be characterized by optimizing one or more communication parameters such as bandwidth, latency, jitter, signal-to-noise ratio (SNR), frequency (band) re-use, etc. Optimizing mesh network 28 may be subject to changing demands and therefore wireless devices 10 may change their respective locations along cables 11 continuously or repeatedly, and/or in real time.

The term communication equipment and communication terminal refer to any type of computational unit capable of connecting to any type of communication network, including a server, a communication node, a computer, a laptop computer, a tablet computer, a PDA, a wireless telephone (such as mobile telephone, cellular telephone, smart telephone, etc.), a wearable communication device, a wireless device 10, etc.

The wireless device 10 may use its local area communication module 18 to provide a wireless local area communication network (WLAN) 32, and to communicate with, or provide network connectivity for, any type of communication terminal such as terminal 33.

It is appreciated that terminal 33 may be any type of computational device, and/or communication equipment, including, but not limited to, a computer, a laptop computer, a tablet computer, a PDA, a wireless telephone (such as mobile telephone, cellular telephone, smart telephone, etc.), a wearable communication device, a wireless device 10, etc.

It is appreciated that terminal 33 may communicate via any one or more or a combination of WLAN (WLAN) 32, wireless devices 10, mesh network 28, backhaul units 27, long distance network 29, and server 31 with any other communication equipment and/or communication terminal including any other wireless devices 10 and/or terminal 33.

It is appreciated that wireless devices 10 may maneuver themselves, using their respective self-propulsion capabilities to modify the distribution of the wireless devices 10 over the electric distribution network 26 according to the requirements of terminals 33 within a particular local area. Such changing requirements may evolve from the number of terminals 33 within a particular local area, or their cumulative communication requirements such as bandwidth.

Optimizing the distribution, or topology, of the WLAN (WLAN) 32 may be characterized by optimizing one or more communication parameters such as bandwidth, latency, jitter, signal-to-noise ratio (SNR), frequency (band) re-use, etc. Optimizing the WLAN (WLAN) 32 topology may be subject to changing demands and therefore wireless devices 10 may change their respective locations along cables 11 continuously or repeatedly, and/or in real time.

The wireless device 10 may use its remote sensing module 19 and associated sensors (e.g., temperature sensor, camera, microphone, gas and/or pollution sensor, light sensor, etc.) to provide remote sensing of its environment.

It is appreciated that wireless devices 10 may maneuver themselves, using their respective self-propulsion capabilities to modify the distribution of the wireless devices 10 over the electric distribution network 26 according to remote sensing requirements within a particular local area. Such changing requirements may evolve from the need to photograph a particular scenery from particular angle or distance, or to record particular sounds. Optimizing the location of one or more wireless devices 10 by changing their respective locations along cables 11 is subject to changing remote sensing requirements and is thus executed continuously or repeatedly, and/or in real time.

It is appreciated that a wireless device 10 may be moved along cable 11 manually (e.g., by manually pushing or pulling device 10) and/or using its self-propulsion capability (e.g., by means of electric motor 24). It is appreciated that a decision to move wireless device 10 along cable 11 may be taken the controller module 16 if the wireless device 10, and/or by a processor of a backhaul unit 27, and/or by a central server such as remote server 31, and/or by user, such as an operator controlling the distribution of wireless devices 10, and/or the WLAN (WLAN) 32, and/or any type of remote sensing service.

It is appreciated that a wireless device 10 may be moved along cable 11 without disrupting or adversely affecting the service it provides such as WLAN (WLAN) 32, and/or any type of remote sensing service. It is noted that wireless device 10 feeds on the mains supply while being in motion and thus provides a continuous services such as wireless communication and remote sensing. It is noted that wireless device 10 provides a continuous services such as wireless communication and remote sensing, as well as the reconfiguration of the mesh network topology, without relying on a portable power supply such as a battery or a portable generator.

It is appreciated that certain features, which are, for clarity, described in the context of separate embodiments, may also be provided in combination in a single embodiment. Conversely, various features, which are, for brevity, described in the context of a single embodiment, may also be provided separately or in any suitable sub-combination.

Although descriptions have been provided above in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art.

What is claimed is:

1. A device comprising:
   a power supply module operative to extract electric power from at least one of electric field and magnetic field surrounding an electric cable;
   at least one transceiver operative to communicate in at least one communication network;
   a propulsion module for maneuvering said device along said electric cable; and
   a controller module communicatively coupled to said at least one transceiver, said propulsion module, and said power supply module,
   wherein said device is mounted around a single electric cable of at least one of an electric transmission grid and an electric distribution grid,
   wherein said device derives power from said single electric cable,
   wherein said device is operative to provide network connectivity between a first separate communications device, and a second separate communication device, and
   wherein said controller is operative to receive, from at least one of said first separate communications device and said second separate communication device, a requirement to maneuver said device, over said cable, using said propulsion module, to improve a communication parameter with at least one of said first separate communications device and said second separate communication device.

2. The device according to claim 1, wherein said at least one communication network is at least one of a wireless network and a PLC network.

3. The device according to claim 2,
   wherein said wireless communication network is at least one of a LAN network and a backhaul network,
   wherein said at least one transceiver is at least one of
      a LAN transceiver operative to communicate in a wireless local area network (LAN) with said first separate communications device, and
      a backhaul transceiver operative to communicate in a backhaul network with said second separate device, and
   wherein said controller module is additionally communicatively coupled to said at least one of backhaul transceiver and LAN transceiver.

4. The device according to claim 3, wherein said LAN transceiver and said backhaul transceiver are communicatively coupled with each other.

5. The device according to claim 1, being additionally operative to provide communication between said first separate communication device and said second separate communication device while maneuvering said device over said cable and while extracting electric power from said magnetic field surrounding said electric cable.

6. The device according to claim 1, wherein said communication parameter is associated with at least one of bandwidth, jitter and signal-to-noise ratio (SNR).

7. The device according to claim 1, wherein said communication network is a mesh network comprising a plurality of said devices according to claim 1, and wherein said plurality of said devices of said mesh network are operative to change the topology of said mesh network according to said requirement received from said at least one of said first separate communications device and said second separate communication device.

8. The device according to claim 7, wherein said changing the topology of said mesh network is performed without disrupting or adversely affecting service provided by said mesh network.

9. A method comprising the steps of:
   providing a device comprising
      a power supply module operative to extract electric power from at least one of electric field and magnetic field surrounding an electric cable,
      at least one transceiver operative to communicate in at least one communication network,
      a propulsion module for maneuvering said device along said electric cable, and
      a controller module communicatively coupled to said at least one transceiver, said propulsion module, and said power supply module,
   wherein said device is mounted around a single electric cable of at least one of an electric transmission grid and an electric distribution grid, and wherein said device derives power from said single electric cable;
providing network connectivity between a first separate communications device, and a second separate communication device; and
receiving, by said controller, from at least one of said first separate communications device and said second separate communication device, a requirement to maneuver said device, over said cable, using said propulsion module, to improve a communication parameter with at least one of said first separate communications device and said second separate communication device.

10. The method according to claim 9, wherein said at least one communication network is at least one of a wireless network and a PLC network.

11. The method according to claim 10,
wherein said wireless communication network is at least one of a LAN network and a backhaul network,
wherein said at least one transceiver is at least one of
   a LAN transceiver operative to communicate in a wireless local area network (LAN) with said first separate communications device, and
   a backhaul transceiver operative to communicate in a backhaul network with said second separate device, and
wherein said controller module is additionally communicatively coupled to said at least one of backhaul transceiver and LAN transceiver.

12. The method according to claim 11, wherein said LAN transceiver and said backhaul transceiver are communicatively coupled with each other.

13. The method according to claim 9, additionally comprising:
providing said communication between said first separate communication device and said second separate communication device while maneuvering said device over said cable, and while extracting electric power from said magnetic field surrounding said electric cable.

14. The method according to claim 9, wherein said communication parameter is associated with at least one of: bandwidth, jitter and signal-to-noise ratio (SNR).

15. The method according to claim 9, wherein said communication network is a mesh network comprising a plurality of said devices according to claim 1, and wherein said plurality of said devices of said mesh network are operative to change the topology of said mesh network according to said requirement received from said at least one of said first separate communications device and said second separate communication device.

16. The method according to claim 15, wherein said changing the topology of said mesh network is performed without disrupting or adversely affecting service provided by said mesh network.

* * * * *